(12) United States Patent
Kiefer et al.

(10) Patent No.: US 10,709,031 B2
(45) Date of Patent: Jul. 7, 2020

(54) FASTENING SYSTEM AND METHOD, MOUNTING RACK AND POWER ELECTRONICS INSTALLATION

(71) Applicant: Dr. Ing. h.c. F. Porsche Aktiengesellschaft, Stuttgart (DE)

(72) Inventors: Michael Kiefer, Stuttgart (DE); Karsten Hähre, Dudenhofen (DE); Bekim Basha, Böblingen (DE)

(73) Assignee: Dr. Ing. h.c. F. Porsche Aktiengesellschaft (DE)

( * ) Notice: Subject to any disclaimer, the term of this patent is extended or adjusted under 35 U.S.C. 154(b) by 0 days.

(21) Appl. No.: 15/975,868

(22) Filed: May 10, 2018

(65) Prior Publication Data
US 2019/0008067 A1    Jan. 3, 2019

(30) Foreign Application Priority Data

Jun. 29, 2017  (DE) .................. 10 2017 114 512

(51) Int. Cl.
| | |
|---|---|
| *H05K 7/14* | (2006.01) |
| *H05K 7/18* | (2006.01) |
| *H02B 1/01* | (2006.01) |
| *H02B 1/36* | (2006.01) |

(52) U.S. Cl.
CPC ........... *H05K 7/1488* (2013.01); *H02B 1/012* (2013.01); *H02B 1/36* (2013.01); *H05K 7/1425* (2013.01); *H05K 7/18* (2013.01)

(58) Field of Classification Search
CPC .. H05K 7/1488; H05K 7/1489; H05K 7/1425; H02B 1/36; H02B 1/012; H04Q 1/13; H04Q 1/131; H04Q 1/133; H04Q 1/142; H04Q 1/155

USPC .......................................................... 211/26
See application file for complete search history.

(56) References Cited

U.S. PATENT DOCUMENTS

| | | | | |
|---|---|---|---|---|
| 3,470,420 | A * | 9/1969 | Marks .................. | H05K 7/1425 211/41.17 |
| 5,176,529 | A * | 1/1993 | Heinz .................. | H01R 13/703 439/181 |
| 5,542,549 | A * | 8/1996 | Siemon ................ | H04Q 1/14 211/189 |
| 6,123,203 | A * | 9/2000 | Gibbons .............. | H05K 7/1421 211/26 |
| 6,170,784 | B1 * | 1/2001 | MacDonald ......... | H05K 7/1448 211/26 |
| 6,785,459 | B2 * | 8/2004 | Schmidt .............. | G02B 6/4471 211/26 |

(Continued)

FOREIGN PATENT DOCUMENTS

| | | |
|---|---|---|
| CN | 204179495 U | 2/2012 |
| GB | 2289618 A | 5/1995 |

OTHER PUBLICATIONS

Chinese Office Action for Chinese Application No. 201810667643.X, dated Feb. 6, 2020, 7 pages.

*Primary Examiner* — Patrick D Hawn
(74) *Attorney, Agent, or Firm* — RatnerPrestia

(57) ABSTRACT

A fastening system for a mounting rack includes a terminal strip having bores through which screws may pass. The bores are arranged relative to one another in such a way that the screws can be screwed into the mounting rack. Also disclosed is a corresponding method for fastening assemblies to a mounting rack, a corresponding mounting rack and a corresponding power-electronics installation.

14 Claims, 3 Drawing Sheets

(56) References Cited

U.S. PATENT DOCUMENTS

| | | | | |
|---|---|---|---|---|
| 6,818,834 B1* | 11/2004 | Lin | ............................ | H02G 3/32 |
| | | | | 174/135 |
| 7,360,659 B1* | 4/2008 | Yoon | ...................... | H02B 1/306 |
| | | | | 16/221 |
| 7,693,387 B2* | 4/2010 | Weinegger | ............ | G02B 6/4471 |
| | | | | 385/134 |
| 8,093,499 B2* | 1/2012 | Hoffer | ................... | H02G 3/0456 |
| | | | | 174/68.1 |
| 8,448,791 B2* | 5/2013 | Zhang | ................... | H05K 7/1489 |
| | | | | 211/26 |
| 8,807,351 B2* | 8/2014 | Lin | ......................... | A47B 88/43 |
| | | | | 211/26 |
| 8,901,418 B2* | 12/2014 | Walker | .................. | H05K 5/0247 |
| | | | | 174/50 |
| 9,703,061 B1* | 7/2017 | Fernandez | .......... | H04Q 11/0066 |
| 2006/0180555 A1* | 8/2006 | Shih | ..................... | H05K 7/1489 |
| | | | | 211/26 |
| 2006/0180556 A1* | 8/2006 | Shih | ..................... | H05K 7/1489 |
| | | | | 211/26 |
| 2012/0024803 A1* | 2/2012 | Replogle | .................. | H04Q 1/09 |
| | | | | 211/26 |
| 2015/0090677 A1* | 4/2015 | Shao | ..................... | H05K 7/1489 |
| | | | | 211/26 |

\* cited by examiner

FASTENING SYSTEM AND METHOD, MOUNTING RACK AND POWER ELECTRONICS INSTALLATION

CROSS-REFERENCE TO RELATED APPLICATION

This application claims priority to German Patent Application No. DE 10 2017 114 512.5, filed Jun. 29, 2017, which is incorporated by reference herein in its entirety.

FIELD OF THE INVENTION

The present invention relates to a fastening system for mounting racks. The present invention further relates to a corresponding method for fastening assemblies to a mounting rack, to a corresponding mounting rack and also to a corresponding power-electronics installation.

BACKGROUND OF THE INVENTION

In electrical engineering, a charging station is any stationary apparatus or electrical installation which serves to supply energy to mobile rechargeable battery-operated devices, machines or motor vehicles by simple placement or insertion, without the energy store—for example the traction battery of an electric car—having to be removed. Charging stations for electric cars are sometimes also called "electricity charging stations" and can comprise a plurality of charging points.

In particular, high-performance charging (HPC) systems such as the so-called combined charging system (CCS) which is widespread throughout Europe are known in this respect. During direct-current charging of this generic type, direct current is fed from the charging column directly into the vehicle and, for this purpose, provided by way of a powerful rectifier from the power grid or by way of large buffer accumulators at solar charging stations. The vehicle contains a battery management system which communicates with the charging column in order to adjust the current intensity or to terminate the process when a capacitance limit is reached.

In this case, the power electronics are usually located in the charging column. Since the direct-current connections of the charging column are connected directly to corresponding connections of the traction battery, high charging currents can be transmitted with a low level of loss, this allowing short charging times but also generating a considerable amount of waste heat.

CN 204179495, which is incorporated by reference herein, discloses a support for a low-voltage switchgear cabinet. The support consists of two symmetrical fixed supports which are flush to the left and a moving carriage. Each of the fixed supports has a Z-shaped structure and has a parallel fixed plate. A clamping groove is arranged in the center of each of the parallel fixed plates. A vertical tension plate is vertically connected to each of the parallel fixed plates. A plurality of passage grooves are arranged in the lower section of each of the vertical tension plates. A plurality of tension strips are formed beneath the passage grooves and bend upward at a distance, so that clamping hooks are formed. Two top edges of the moving carriage are provided with a plurality of clamping holes which correspond to the clamping hooks. Metric fastening holes are arranged in two side edges of the moving carriage.

GB 2 289 618, which is incorporated by reference herein, relates to a pull-out apparatus for a telecommunications device frame which is intended to be fastened to a vertical apparatus frame on its two opposite vertical sides, wherein it has first pull-out parts, which are detachably fastened to fastening projections on said opposite vertical sides of the frame, and second pull-out parts which are detachably fastened to outer faces of the apparatus frame which face said fastening projections next to the first pull-out parts, wherein the first pull-out part is supported by the second pull-out part on both sides of the arrangement and is arranged so as to slide therein, and the first and the second pull-out parts are located entirely outside the telecommunications device frame and apparatus frame.

SUMMARY OF THE INVENTION

The invention provides a fastening system for mounting racks, a corresponding method for fastening assemblies to a mounting rack, a corresponding mounting rack and also a corresponding power-electronics installation as claimed in the independent claims.

The approach according to aspects of the invention is based on the idea of incorporating the power-electronics system, which is required for converting the electrical energy, in a mounting rack which has a width of 48.26 cm in accordance with the so-called 19-inch rack which is standardized in EIA 310-D, IEC 60297 and DIN 41494 SC48D. Therefore, the power electronics can be distributed in a modular manner between a plurality of relatively small 19-inch assemblies ("inserts"). The high power density of systems of this kind requires compact mounting options for the 19-inch inserts. In addition, the service concept requires rapid and simple mounting and replacement options for the 19-inch inserts both during initial mounting and also during operation.

The proposed solution makes it possible to significantly simplify this replacement of 19-inch inserts of the power electronics. Therefore, some components can be installed in front of the 19-inch inserts given optimum utilization of the limited installation space. These additional components, for their part, can be arranged in such a way that it is possible to withdraw the 19-inch inserts. Therefore, a wide front plate on the part of the inserts which would reduce the installation space available for additional components or even require removal thereof before the 19-inch inserts can be removed can be dispensed with. The working time associated with removal of this kind can be saved in this way.

Further advantageous refinements of the invention are specified in the dependent patent claims. For example, a corresponding method for mounting and removing 19-inch inserts in a charging park system can reduce screw connections and working time. At the same time, more installation space can be made available in front of the 19-inch inserts. It goes without saying that other fastening means, such as quick-action clip connections for example, can also be used instead of screws.

BRIEF DESCRIPTION OF THE DRAWINGS

An exemplary embodiment of the invention is illustrated in the drawings and will be described in more detail below.

DETAILED DESCRIPTION OF THE INVENTION

Figure 1:
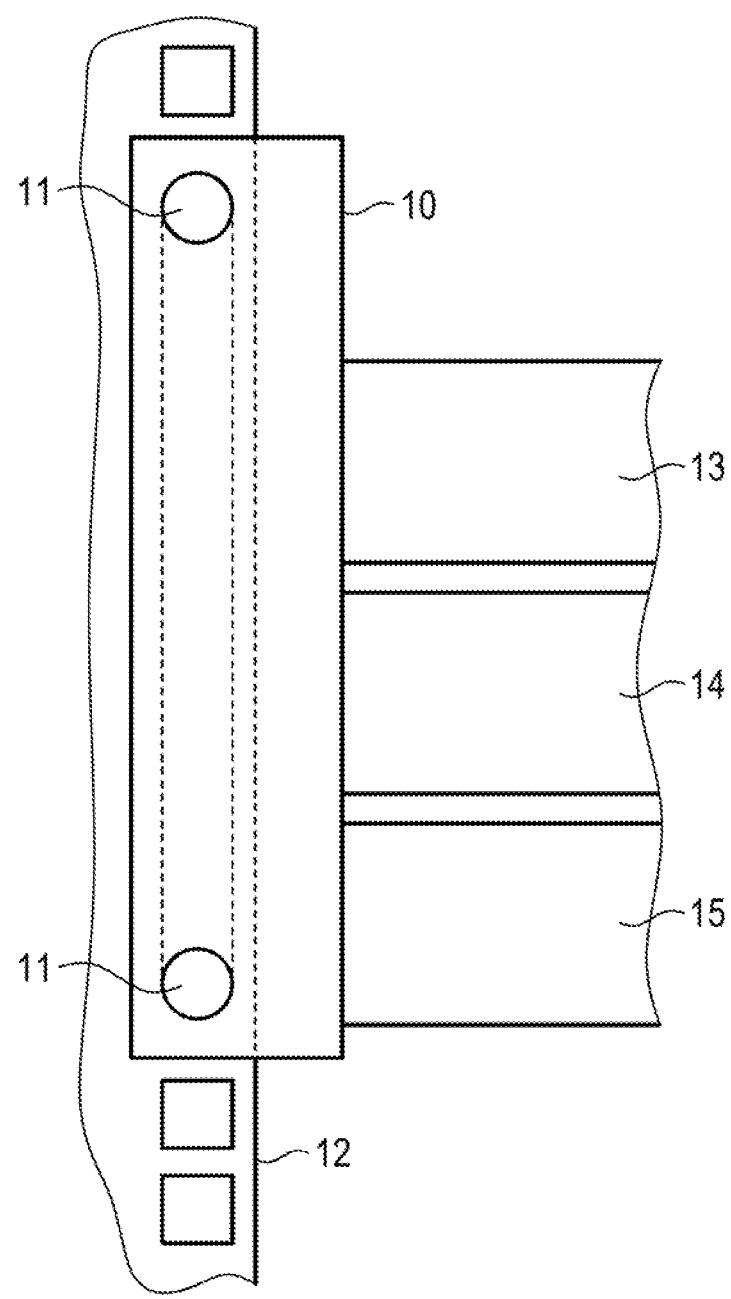
FIG. 1 shows the front view of a fastening system according to aspects of the invention.
Figure 2:
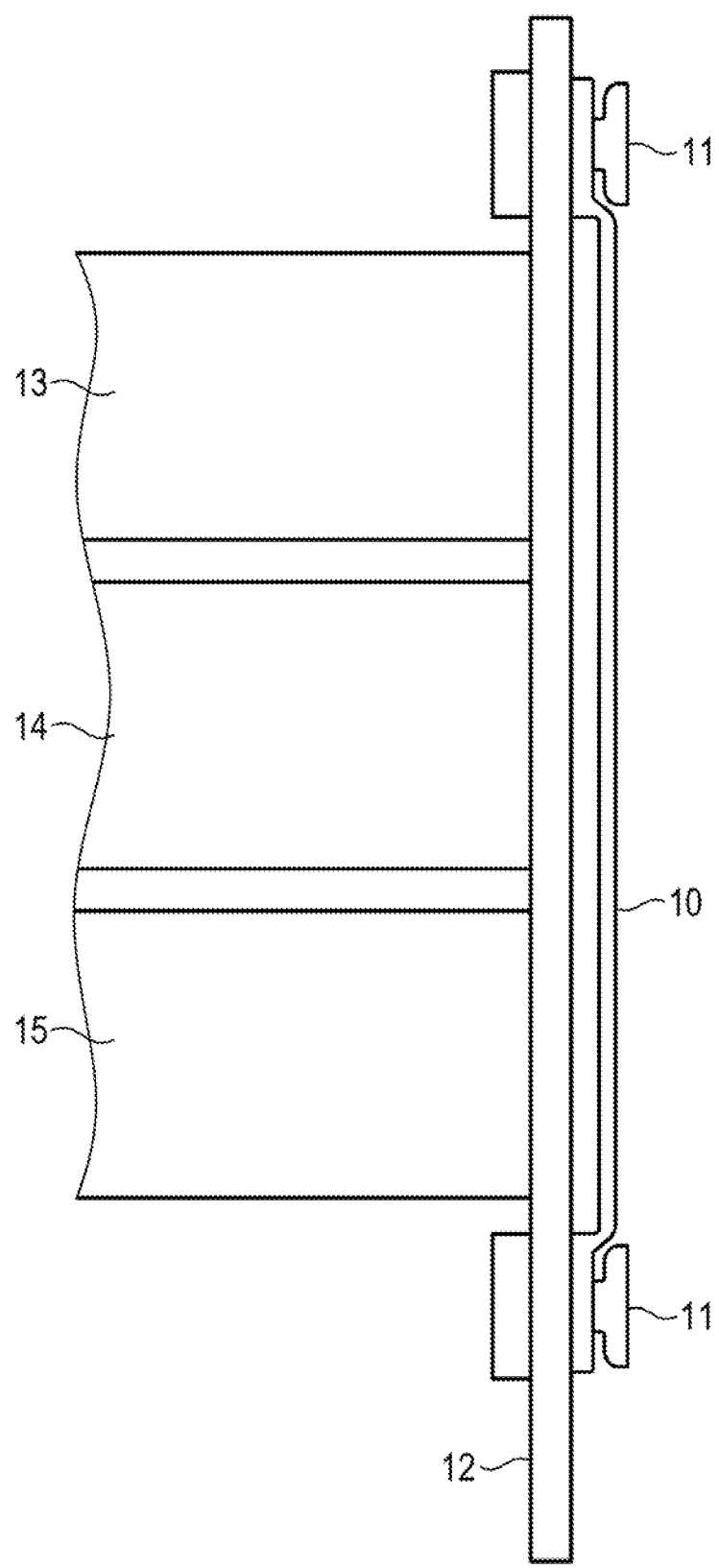
FIG. 2 shows the side view of the fastening system of FIG. 1.

FIGS. 1 and 2, when considered together, illustrate the fundamental structure of a fastening system (10, 11) according to one embodiment of the invention. The essential element of this refinement is a terminal strip (10) having longitudinally opposite bores for M5 or M6 screws (11) to pass through, said screws engaging into corresponding snap-action or cage nuts—not illustrated in the drawing—in the square or round punched holes of the rectangular punched metal sheet which forms the frame of the mounting rack (12).

It goes without saying that a punched metal sheet with threaded bores—for example in accordance with ANSI/ASME B1.1-2003—may also be used instead. Similarly, a large number of different profiles can be used instead of the cross slots according to the figures for driving the screws (11), without departing from the scope of the invention. Finally, the screw heads, which are lens-like in the present case and can be seen in FIG. 2 in particular, may assume a conical or disk shape for example.

Figure 3:
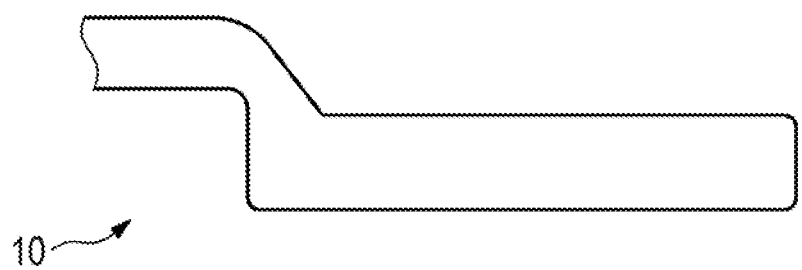
FIG. 3 shows the cross section through a terminal strip of the fastening system.

FIG. 3 examines the cross section of the terminal strip (10). Said cross section is selected such that the contact pressure required for fastening the assemblies (13, 14, 15) to the mounting rack (12) can be effortlessly exerted by the screws (11). A support surface which is offset in relation to the bores and by means of which the terminal strip (10) is placed onto the assemblies (13, 14, 15) primarily serves for this purpose after said assemblies have been inserted into the mounting racks (12) as far as the rear-side stop. For this purpose, the support surface is dimensioned to be just large enough to fix the terminal strip (10) on the front plate of the assemblies (13, 14, 15). An excess length of the front plates—and therefore a corresponding excess width of the assemblies (13, 14, 15)—is unnecessary here. In addition, the terminal strip (10) can be fixed and released by a small number of screws (11), this saving time and material in comparison to fixing of the front plate of each individual assembly. Owing to the rear-side stop of the assemblies (13, 14, 15) which is generally formed by a suitable rear plate of the mounting rack (12), said assemblies are nevertheless prevented from slipping.

What is claimed is:

1. Mounting rack system comprising:
    a mounting rack comprising a mounting face including openings for receiving fasteners, the mounting face terminating at a vertically extending edge that is positioned adjacent to a plurality of electronics assemblies that are each independently positionable within the mounting rack and stacked on top of one another in a vertical direction;
    a terminal strip having (i) a mounting surface that is configured to be mounted to the mounting face of the mounting rack, (ii) bores defined in the mounting surface that are each sized to receive a screw, wherein the bores are arranged relative to one another in such a way that the screws can each be screwed into one of the bores of the terminal strip and one of the openings of the mounting rack, and (iii) a supporting surface which is offset in relation to the mounting surface and protrudes in a direction away from the mounting surface and the plurality of electronics assemblies, wherein the terminal strip extends along only a portion of a width of the mounting rack,
    wherein the supporting surface is positionable over the plurality of electronics assemblies and sized to overlap all of the plurality of electronics assemblies in the vertical direction so as to prevent the plurality of electronics assemblies from becoming detached from the mounting rack,
    wherein a first vertically extending free edge of the terminal strip, which is mounted to the mounting rack, does not overlap the plurality of electronics assemblies in a widthwise direction across the mounting rack, and a second vertically extending free edge of the terminal strip, which is opposite the first vertically extending free edge, overlaps the plurality of electronics assemblies in the widthwise direction,
    wherein, as viewed in the widthwise direction, the openings in the mounting rack and the first vertically extending free edge of the terminal strip are arranged on one side of the vertically extending edge of the mounting face of the mounting rack, and
    wherein, as viewed in the widthwise direction, the second free edge of the terminal strip and the plurality of electronics assemblies are arranged on an opposite side of the vertically extending edge of the mounting face of the mounting rack.

2. The mounting rack system as claimed in claim 1, wherein the terminal strip has a cross section configured in such a way that a contact pressure which is required for fastening assemblies to the mounting rack can be exerted by the screws.

3. The mounting rack system as claimed in claim 2, wherein the bores are arranged on longitudinally opposite sides of the terminal strip.

4. The mounting rack system as claimed in claim 1, wherein the fastening system further comprises the screws and the screws have lens-like heads.

5. The mounting rack system as claimed in claim 4, wherein the screws have a metric ISO standard thread with a nominal size of M5 or M6.

6. The mounting rack system as claimed in claim 4, wherein the heads each have a cross slot.

7. A power-electronics installation comprising the mounting rack as claimed in claim 1.

8. The mounting rack system as claimed in claim 1, wherein a width of the terminal strip is divided between a first portion that is configured to be connected to the mounting rack and a second portion that extends over the plurality of electronics assemblies.

9. The mounting rack system as claimed in claim 1, wherein a width of the terminal strip is constant along a lengthwise dimension of the terminal strip, and wherein the bores are spaced apart along the lengthwise dimension.

10. The mounting rack fastening system as claimed in claim 1, wherein the terminal strip is a single, unitary component.

11. The mounting rack system as claimed in claim 1,
    wherein a width of the terminal strip is divided between a first portion that is configured to be connected to the mounting rack and a second portion that extends over the plurality of electronics assemblies,
    wherein the terminal strip is a single, unitary component,
    wherein a width of the terminal strip is constant along a lengthwise dimension of the terminal strip, and
    wherein the bores are spaced apart along the lengthwise dimension.

12. The mounting rack system as claimed in claim 1, wherein, as viewed in the widthwise direction, the openings in the mounting rack are positioned closer to the first vertically extending free edge than the second vertically extending free edge.

13. The mounting rack system as claimed in claim 1, wherein, as viewed in the widthwise direction, the bores in the terminal strip are positioned closer to the first vertically extending free edge than the second vertically extending free edge.

14. The mounting rack system as claimed in claim 1, wherein, as viewed in the widthwise direction, the first vertically extending free edge of the terminal strip is positioned further from the vertically extending edge of the mounting face of the mounting rack than the second vertically extending free edge.

* * * * *